United States Patent
Xiang et al.

(10) Patent No.: US 9,214,433 B2
(45) Date of Patent: Dec. 15, 2015

(54) CHARGE DAMAGE PROTECTION ON AN INTERPOSER FOR A STACKED DIE ASSEMBLY

(71) Applicant: Xilinx, Inc., San Jose, CA (US)

(72) Inventors: Qi Xiang, San Jose, CA (US); Xiao-Yu Li, San Jose, CA (US); Cinti X. Chen, San Jose, CA (US); Glenn O'Rourke, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 13/899,129

(22) Filed: May 21, 2013

(65) Prior Publication Data
US 2014/0346651 A1    Nov. 27, 2014

(51) Int. Cl.
| | |
|---|---|
| H01L 23/552 | (2006.01) |
| H01L 23/60 | (2006.01) |
| H01L 21/82 | (2006.01) |
| H01L 25/065 | (2006.01) |
| H01L 25/07 | (2006.01) |
| H01L 25/18 | (2006.01) |
| H01L 23/00 | (2006.01) |

(52) U.S. Cl.
CPC ............... *H01L 23/60* (2013.01); *H01L 21/82* (2013.01); *H01L 24/73* (2013.01); *H01L 25/0652* (2013.01); *H01L 25/0655* (2013.01); *H01L 25/071* (2013.01); *H01L 25/072* (2013.01); *H01L 25/18* (2013.01)

(58) Field of Classification Search
CPC ......... H01L 21/20; H01L 23/55; H01L 23/60; H01L 21/82; H01L 25/0652; H01L 25/0655; H01L 25/072; H01L 25/18; H01L 24/73
USPC ........... 257/659, 207, 678, 621, 173, E21.09, 257/E21.37, E23.07, 390, 529; 438/491, 438/965, 126, 637, 121, 614, 667, 386, 666, 438/15, 107, 119
See application file for complete search history.

(56) References Cited

U.S. PATENT DOCUMENTS

| | | | | |
|---|---|---|---|---|
| 5,117,129 A | * | 5/1992 | Hoffman et al. | 326/13 |
| 6,097,045 A | * | 8/2000 | Min | 257/233 |
| 6,222,212 B1 | * | 4/2001 | Lee et al. | 257/207 |
| 7,977,218 B2 | | 7/2011 | Chen et al. | |
| 2002/0153593 A1 | | 10/2002 | Chen et al. | |
| 2008/0220580 A1 | * | 9/2008 | Kato et al. | 438/275 |
| 2010/0237386 A1 | * | 9/2010 | Lin et al. | 257/173 |
| 2011/0089572 A1 | * | 4/2011 | Tezcan et al. | 257/774 |
| 2012/0248569 A1 | | 10/2012 | Jenkins et al. | |

(Continued)

OTHER PUBLICATIONS

Li, Xiao-Yu, et al., "Degraded CMOS Hot Carrier Life Time-Role of Plasma Etching Induced Charging Damage and Edge Damage IRPS", IRPS, 1995 33rd Annual Proceedings of IEEE International Reliability Physics Symposium, Apr. 4-6, 1995, pp. 260-265, Las Vegas, NV.

*Primary Examiner* — Amar Movva
*Assistant Examiner* — Sheikh Maruf
(74) *Attorney, Agent, or Firm* — W. Eric Webostad; Keith Taboada

(57) ABSTRACT

An apparatus relating generally to an interposer is disclosed. In such an apparatus, the interposer has a plurality of conductors and a plurality of charge attracting structures. The plurality of charge attracting structures are to protect at least one integrated circuit die to be coupled to the interposer to provide a stacked die. The plurality of conductors include a plurality of through-substrate vias.

19 Claims, 15 Drawing Sheets

(56) References Cited

U.S. PATENT DOCUMENTS

| | | | |
|---|---|---|---|
| 2013/0001664 A1* | 1/2013 | Khor | 257/300 |
| 2013/0026550 A1* | 1/2013 | Yoshioka | 257/296 |
| 2013/0242500 A1* | 9/2013 | Lin et al. | 361/679.32 |
| 2014/0001609 A1* | 1/2014 | Kuo et al. | 257/659 |
| 2014/0003000 A1* | 1/2014 | McPartlin, Michael Joseph | 361/728 |

* cited by examiner

CHARGE DAMAGE PROTECTION ON AN INTERPOSER FOR A STACKED DIE ASSEMBLY

FIELD OF THE INVENTION

The following description relates to integrated circuit devices ("ICs"). More particularly, the following description relates to an interposer having charge damage protection for a stacked die assembly type of an IC.

BACKGROUND

Integrated circuits have become more "dense" over time, i.e., more logic features have been implemented in an IC of a given size. Unfortunately, having all components on a single die IC has become problematic. Fortunately, multiple die may be stacked to provide a stacked die IC ("stacked die"). Such stacked ide may allow for lower power consumption, less current leakage, greater performance, and/or smaller IC size, among other benefits, as compared with trying to form a comparable single die IC. However, by attaching one or more integrated circuit dies to an interposer to form a stacked die, there are risks of damage associated to such one or more integrated circuit dies which are not present in formation of a single die IC. These damage risks may reduce yield and/or reliability of stacked dies.

Hence, it is desirable and useful to mitigate one or more of such risks of damage to increase stacked die yield and/or reliability.

SUMMARY

An apparatus relates generally to an interposer. In such an apparatus, the interposer has a plurality of conductors and a plurality of charge attracting structures. The plurality of charge attracting structures is to protect at least one integrated circuit die to be coupled to the interposer to provide a stacked die. The plurality of conductors includes a plurality of through-substrate vias.

A method relates generally to formation of an interposer. In such a method, a substrate for the interposer is obtained. A plurality of through-substrate vias and a plurality of charge attracting structures are formed in the substrate. A portion of the plurality of through-substrate vias are coupled to the plurality of charge attracting structures for conduction of charged particles from the plurality of through-substrate vias to the plurality of charge attracting structures.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIGS. 2-1 through 2-3 are respective block diagrams depicting an exemplary process flow for formation of a stacked die from a cross-sectional side view using a wafer-scale or chip-scale fabrication assembly.

FIGS. 3-1 and 3-2 are respective block diagrams illustratively depicting an exemplary interposer wafer from a top view and a bottom view, respectively.

FIG. 4-1 is a block diagram depicting an exemplary portion of a cross-sectional view of the stacked die of FIGS. 2-1 through 2-3.

FIG. 4-2 is a block diagram depicting an exemplary portion of a cross-sectional view of an interposer, which may be of the interposer wafer of FIG. 3.

DETAILED DESCRIPTION

Figure 1:
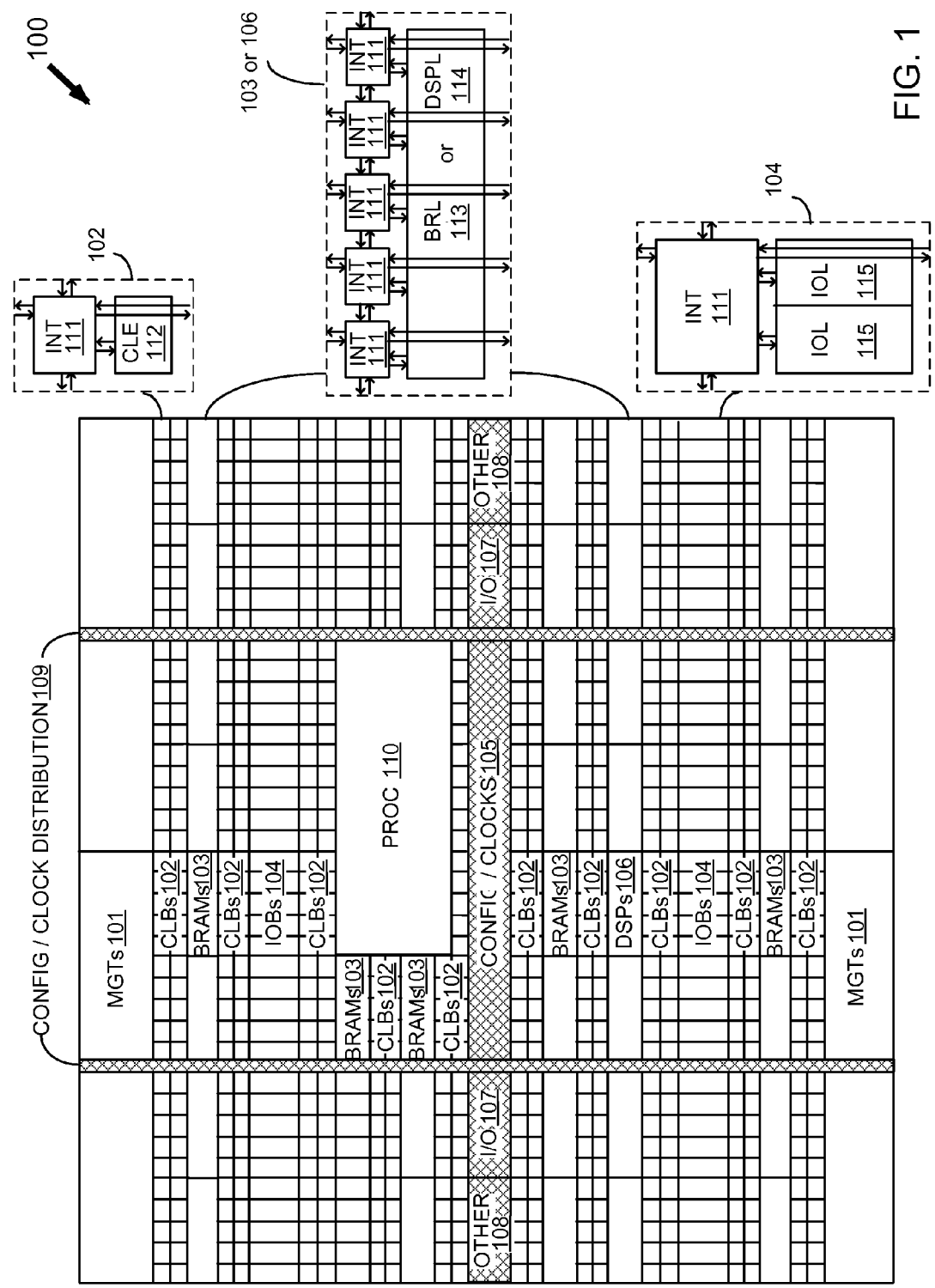
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Recently, multiple dies have been packaged to form a stacked die, where such stacked die includes an interposer die ("interposer") to which one or more integrated circuit dies are coupled. To make such an interposer in a cost effective manner, such interposer has been made as a passive die. Generally, a passive die is a die without any active devices. Unfortunately, such an interposer as a passive die may not have any ESD protection and/or charge protection, and/or may not be designed by applying antenna rules, and adding ESD protection to such a passive die may add considerable cost to formation of such interposer. Furthermore, such interposer may be exposed to processing which uses substantial ionic charges, such as plasma discharges for example, as well as ESD from handling. Because such interposer may collect charged particles, it may be a source of discharge to an integrated circuit die when coupled thereto. A bare integrated circuit die may not have all of its pins protected and/or sufficiently protected against one or more of such discharges, and thus such integrated circuit die may be damaged by such discharge of interposer surface charge to such integrated circuit die.

To mitigate against such damage, an interposer with one or more charge attracting structures are described below. Such charge attracting structures may provide protection to such interposer, as well as providing protection to one or more integrated circuit die "stacked" onto such interposer. These charge attracting structures are not active components in a traditional sense of transistors and diodes, and thus such interposers may be manufactured with such charge attracting structures in a cost effective manner. For example, such charge attracting structures may be large features, and thus not involve state-of-the-art lithography for their manufacture. Furthermore, such charge attracting structures may be formed with more relaxed migration controls and other process parameters, as there are no active devices on such interposers. Moreover, thermal budgets may not be an issue at all for a passive interposer, as it includes no active circuits.

With the above general understanding borne in mind, various embodiments for interposers, and formation thereof, are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Even though the following description is in terms of a stacked die to provide an FPGA or other SoC, the following description is not limited to FPGAs, SoCs, or any particular type of stacked die. Rather the following description applies to any stacked die assembly having an interposer for reasons which shall become apparent from the following description.

Figure 2:
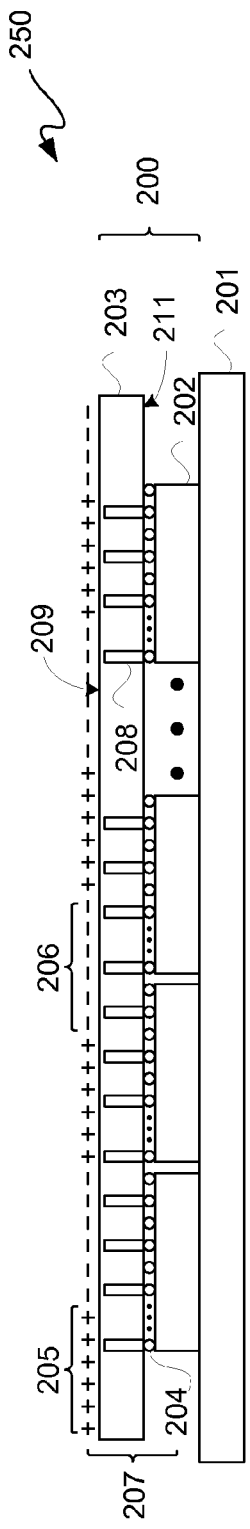
Figure 1:
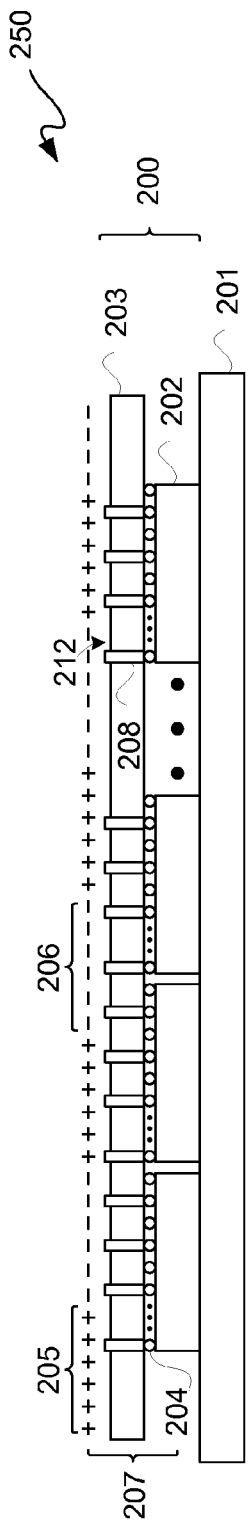
Figure 3:
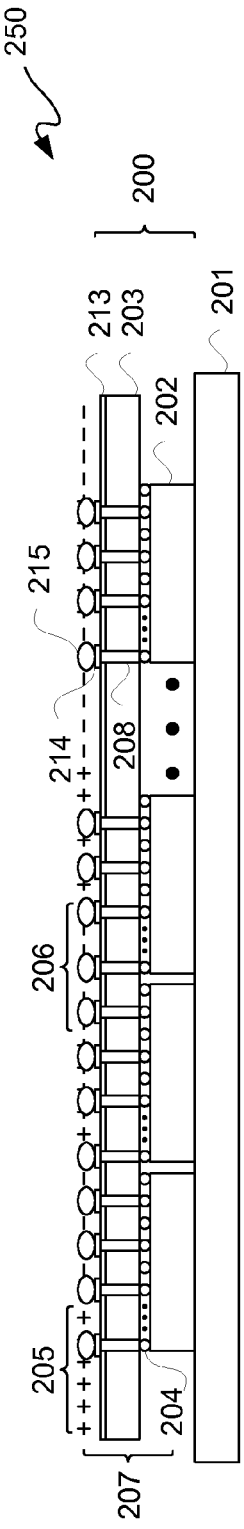
Figures 1, 3:
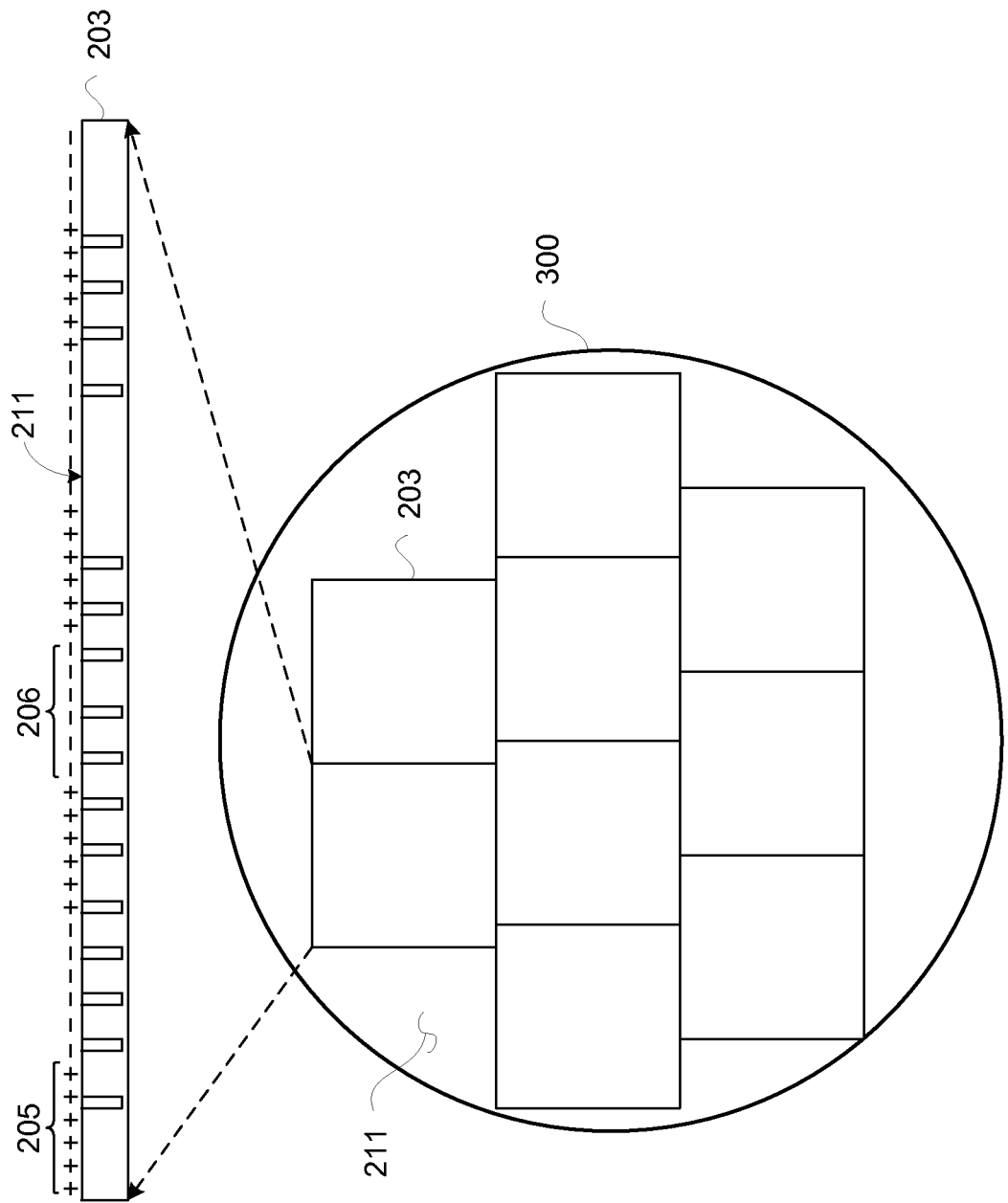
Figures 2, 3:
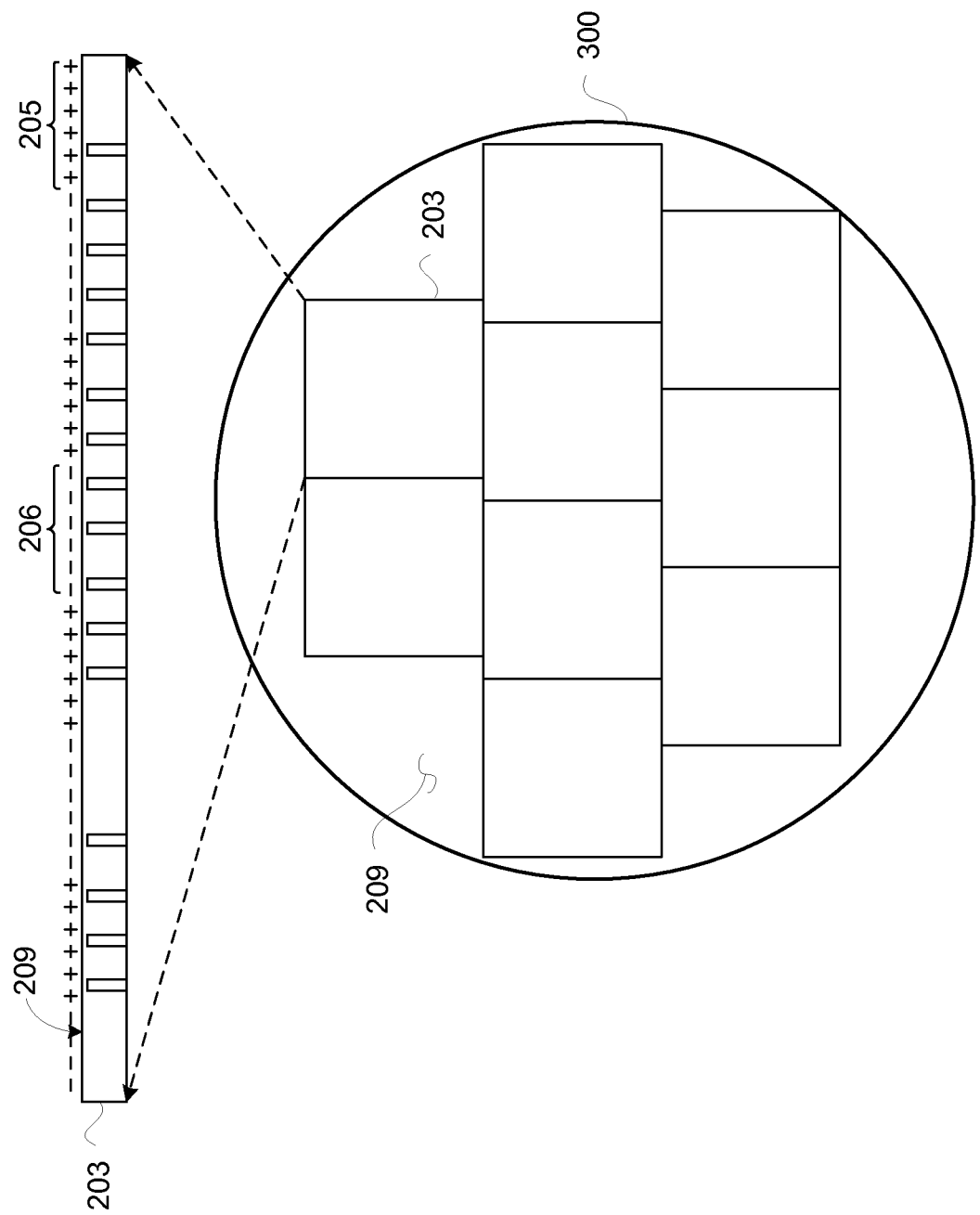

FIGS. 2-1 through 2-3 are respective block diagrams depicting an exemplary process flow for formation of a multiple die or stacked die IC ("stacked die") 200 from a cross-sectional side view using a wafer-scale or chip-scale fabrication assembly ("assembly") 250. In FIG. 2-1, assembly 250 has a carrier 201 having attached thereto one or more integrated circuit dies 202. Integrated circuit dies 202 may be coupled to an interposer 203 via a plurality of micro bumps 204. Integrated circuit dies 202 may include one or more of an FPGA die, a power supply die, a memory die, an optical interface die, and/or a graphics processor die, or any other type or types of integrated circuit die. One or more of such integrated circuit dies 202 may be susceptible to damage from surface charge discharge from interposer 203, as described below in additional detail.

Interposer 203 may still be part of an interposer wafer, as described below in additional detail. In other words, an interposer wafer may or may not have been diced at this juncture. This is generally referred to as a chip-on-wafer flow or CoW flow. Optionally, interposer 203 may have been diced from an interposer wafer at this juncture, and then have one or more of integrated circuit dies attached to it. This is generally referred to as a chip-on-chip flow or CoC flow. In either of such flows, an under fill may be injected between integrated circuit dies and a mold compound may be used to effective bind together integrated circuit dies 202; however, such under fill and mold compound are not illustratively depicted here for purposes of clarity and not limitation. Furthermore, for purposes of clarity and not limitation, it shall be assumed that a CoW flow is used, even though either a CoW flow or a CoC flow may be used.

Interposer 203 may include through-substrate vias ("TSVs") 208. For a silicon substrate, sometimes TSVs are referred to as through-silicon vias. For purposes of clarity and not limitation, it shall be assumed that a silicon substrate is used; however, in other instances another type of material or combination of materials may be used as a semiconductor substrate. In particular, for purposes of clarity and not limitation, it shall be assumed that such silicon substrate is a lightly p-type ("P$^-$") doped substrate. However, in other instances, an n-type doped substrate may be used; however, use of an n-type substrate may affect doping structure and/or layout in order to provide a sufficiently low break down voltage, as may be understood from the following description.

A portion of TSVs 208 may be coupled to a portion of micro bumps 204 for electrical communication with one or more of integrated circuit dies 202. For purposes of clarity and not limitation, TSVs 208 are illustratively depicted as directly coupled to micro bumps 204 in FIGS. 2-1 through 2-3; however, as described in additional detail below, one or more conductor layers and/or one or more via conductor layers may be formed in interposer 203 to provide interconnects for this coupling to one or more micro bumps 204. These interconnects may include one or more ground buses and one or more power buses. For purposes of clarity and not limitation, a single ground bus and a single power bus are described below in additional detail.

At this juncture, a bottom surface 209 ("back side surface") of interposer 203, or a back side surface of an interposer wafer, is facing upward as illustratively depicted, and a top surface 211 ("front side surface") of interposer 203, or a front side surface of an interposer wafer, is facing downward as illustratively depicted. Along those lines, FIGS. 3-1 and 3-2 are respective block diagrams illustratively depicting an interposer wafer ("wafer") 300 from a top view and a bottom view, respectively. Wafer 300 may include a plurality of interposers 203. In FIG. 3-1, a front side surface 211 of wafer 300 is illustratively depicted. Even though back side surface 209 charge accumulation is generally described below with reference to interposer 203, front side surface 211 charge accumulation on interposer wafer 300 may occur as illustratively depicted in FIG. 3-1 with charges 205 and/or 206 on front side surface 211.

In FIG. 3-2, a back side surface 209 of wafer 300 is illustratively depicted. Back side surface 209 charge accumulation on interposer wafer 300 may occur as illustratively depicted in FIG. 3-2 with charges 205 and/or 206 on back side surface 209.

During fabrication of a stacked die 200, sometimes referred to as Stacked Silicon Interconnect Technology or SSIT, an interposer or interposer wafer is exposed to charged particles, electrons, and other forms of energy ("charge"). These charges may include positive charges and/or negative charges. Such charges may come from any of a number of possible sources, including without limitation exposure to a plasma of a plasma-enhanced chemical vapor deposition ("PECVD"), exposure to a plasma of plasma etch ("dry etch"), and/or electrostatic discharge from handling, among other possible sources of exposure to charged particles and electrons.

With simultaneous reference to FIGS. 2-1 through 2-3, 3-1, and 3-2, charges, such as generally depicted as positive charges 205 and negative charges 206, may collect a back side surface 209 and a front side surface 211 of interposer 203. Recall, that micro bumps 204 may be encapsulated at this juncture, so exposure to electrostatic or other electrical discharge may be from outside of such encapsulation at this point in such fabrication. These charges 205 and/or 206 may result in a potential difference 207 between such back side surface 209 and source-drain junctions, or more generally p-n or n-p junctions ("p-n" used interchangeably to refer to either or both p-n and n-p junctions unless expressly indicated otherwise), of transistors and other devices formed in one or more of integrated circuit dies 202.

At this point it is assumed that interposer 203 is what is referred to as a "passive" interposer. In a conventional integrated circuit die, transistors can be protected from plasma damage by antenna rules that limit an area ratio of metal and gate sizes. Furthermore, a conventional integrated circuit die may have Electrostatic Discharge ("ESD") protection circuits. However, for a stacked die, to reduce cost of interposer formation, interposers may only have passive components. For example, a passive interposer may only have micro bumps, metal interconnects, TSVs, under bump metallization ("UMB"), and C4 balls. These passive components may have large widths, lengths, and/or height to reduce resistance-capacitance ("RC") delays. Furthermore, a high density metal layout of an interposer may make a high antenna ratio a significant risk.

Along those lines, if charges 205 and/or 206 are given a conductive path to p-n junctions of an integrated circuit die 202, such charges may cause significant damage, which may cause a device associated therewith to subsequently prematurely fail or be inoperable. Along those lines, FIG. 4-1 is a block diagram depicting an exemplary portion 400 of a cross-sectional view of a stacked die 200 of FIGS. 2-1 through 2-3.

Figures 1, 4:
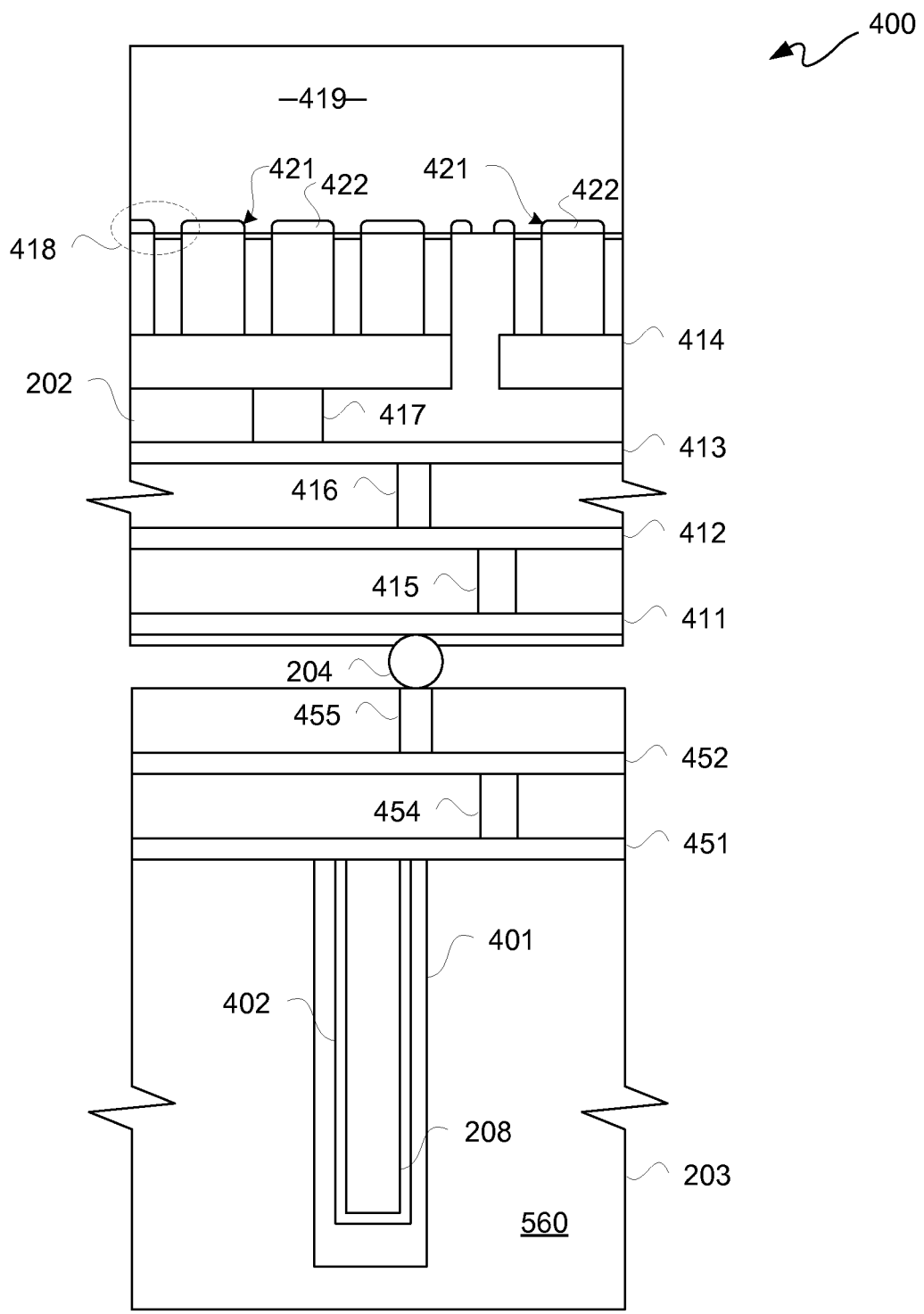
Figures 2, 4:
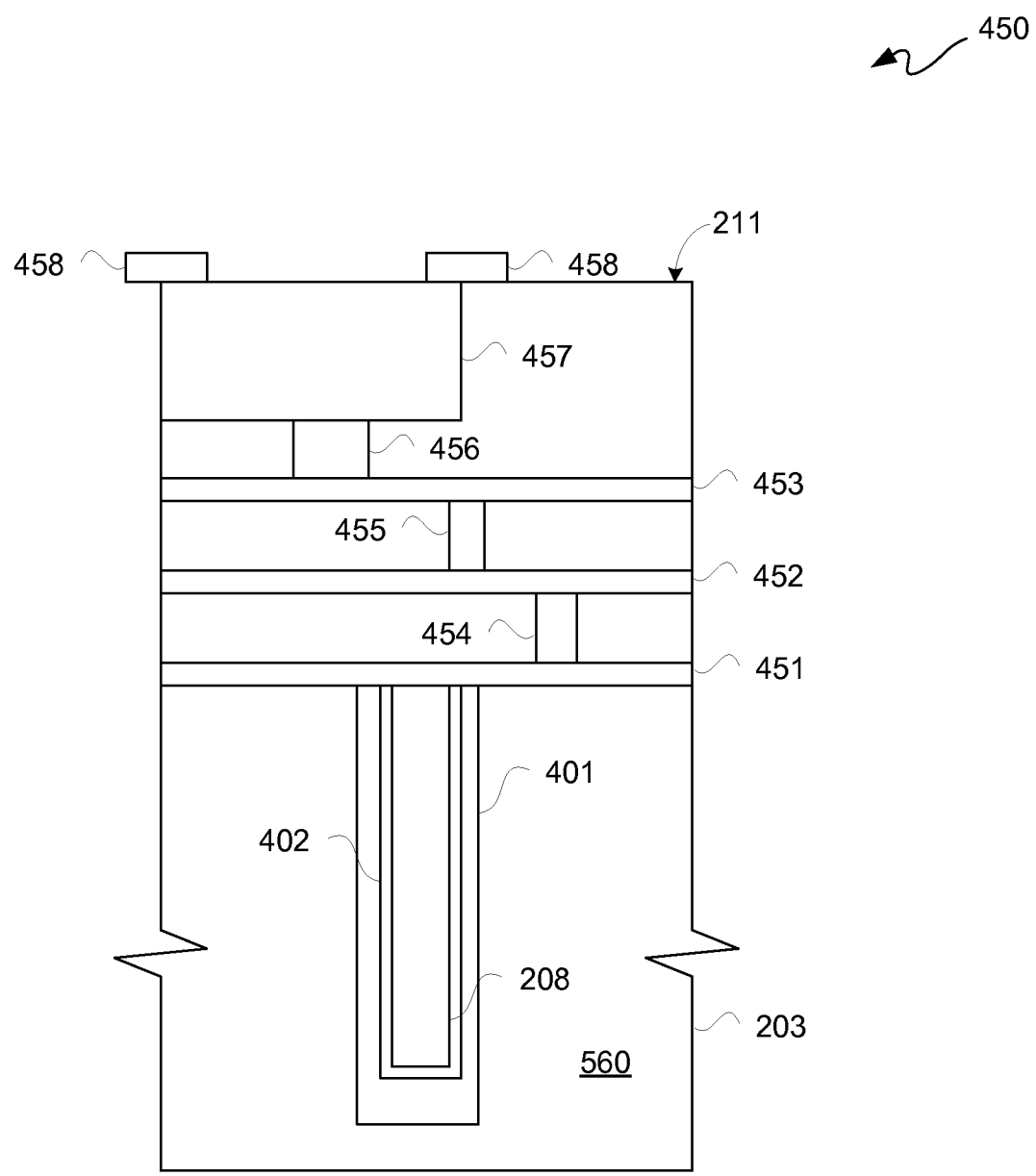

In FIG. 4-1, a TSV 208 may be formed in a substrate 560 of interposer 203, which may be a silicon P⁻ substrate as previously described. TSV 208, which may be formed with copper and may have one or more barrier layers 402 and a dielectric layer 401, of an interposer 203 may be coupled to a conductive layer. In this example, a conductive layer 451 is coupled to TSV 208. Conductive layer 451, which may be a metal layer, may be coupled to conductive layer 452 for example, which may be metal layer, through a conductive via layer 454 for example. Metal layer 452 may be coupled to a conductive via layer 455. Via layers 454 and 455 may both be metal via layers. Metal layers 451 and 452 and via layers 454 and 455 may all be copper-based conductive layers.

Metal via layer 455 may be coupled to a metal layer 411 of integrated circuit die 202 through a micro bump 204. Metal layer 411 may be coupled to one or more other metal layers, such as metal layers 412 and 413 for example, through one or more metal via layers, such as via layers 415 and 416, respectively. Another via layer, such as via layer 417 may be used to couple metal layer 413 to metal layer 414. Metal layer 414 may be coupled to gate stacks, source regions, drain regions, and/or body regions of transistors 418. Substrate 419 of integrated circuit die 202 may have multiple p-n junctions 421 formed therein, including source and drain regions 422.

Additionally, such charge may accumulate on a front side surface 211, and thus during testing of an interposer wafer 300 or interposer 203, prior to micro bump attachment of one or more top integrated circuit dies, there may be damage to an interposer 203 if not properly grounded during testing. Along those lines, with reference to FIG. 4-2, where there is shown a block diagram depicting an exemplary portion 450 of a cross-sectional view of another interposer 203, which may be of an interposer wafer 300.

Portion 450 of interposer 203 is the same as that of FIG. 4-1, except for the following differences. Portion 450 additionally includes a metal layer 453 coupled to via layers 455 and 456 respectively on opposite sides of such metal layer. Via layer 456 couples conductive layer 453 to conductive layer 457. Conductive layer 457 may be coupled to pads 458 of a front side surface 211. Pads 458 may be probe pads. Conductive layer 457 and via layer 456, as well as pads 458, may all be metal-based layers, such as aluminum layers for example. A micro bump 204 may likewise be coupled to portion 450, such as previously described for example, though not illustratively depicted.

As TSV 208 is effective electrically floating or isolated from substrate 560 due to dielectric layer 401, proper grounding of an interposer 203 or interposer wafer 300 during probing or other testing may prove difficult. Along those lines, there may be charge buildup on front side surface 211, and such charge buildup may cause damage if conducted through metal wires to transistors on a top die, namely possibly causing damage or reliability risks to narrow junctions of already very tiny transistors.

With additional reference to FIGS. 2-1 through 2-3, 3-1, and 3-2, in FIG. 2-2, interposer 203, or interposer wafer 300, is illustratively depicted as having undergone an exposer of bottom portions of TSVs 208. With conductive TSVs 208 exposed, charges 205 and/or 206 have a conductive path, or discharge path, to one or more p-n junctions of one or more of integrated circuit dies 202. Again, this discharge path may cause premature failure or inoperability of one or more devices of such integrated circuit dies 202. For purposes of clarity by way of example and not limitation, any plasma exposure that happens after TSVs 208 are exposed can charge up transistors 418 in one or more of integrated circuit dies 202, which may result in severe plasma discharge damage. This charge accumulation can be so high in some instances that transistors suffer source-drain punch through and/or silicide loss as a result of thermal "burnouts" and electro-migration, respectively.

Along the above lines, TSVs 208 are exposed to charges 205 and/or 206 of back side surface 209 after TSVs 208 are initially exposed and potentially exposed to other charges from subsequent processing. For example, recesses 212 between exposed portions of TSVs 208 may be filled, and TSVs 208 may be covered, with a PECVD operation or other operation involving exposure to charges, which may further damage one or more of integrated circuit dies 202. With reference to FIG. 2-3, a fill layer 213 to fill recesses 212 may be followed by a CMP removal of a dielectric layer, such as a nitride layer for example, on top of TSVs or TSV protrusions followed by creation of pads 214 with UBM and formation of C4 balls 215 by a C4 process. Formation of pads 214 and balls 215 may each further involve exposure of TSVs 208 to charges, which may further damage one or more of integrated circuit dies 202.

Figure 5:
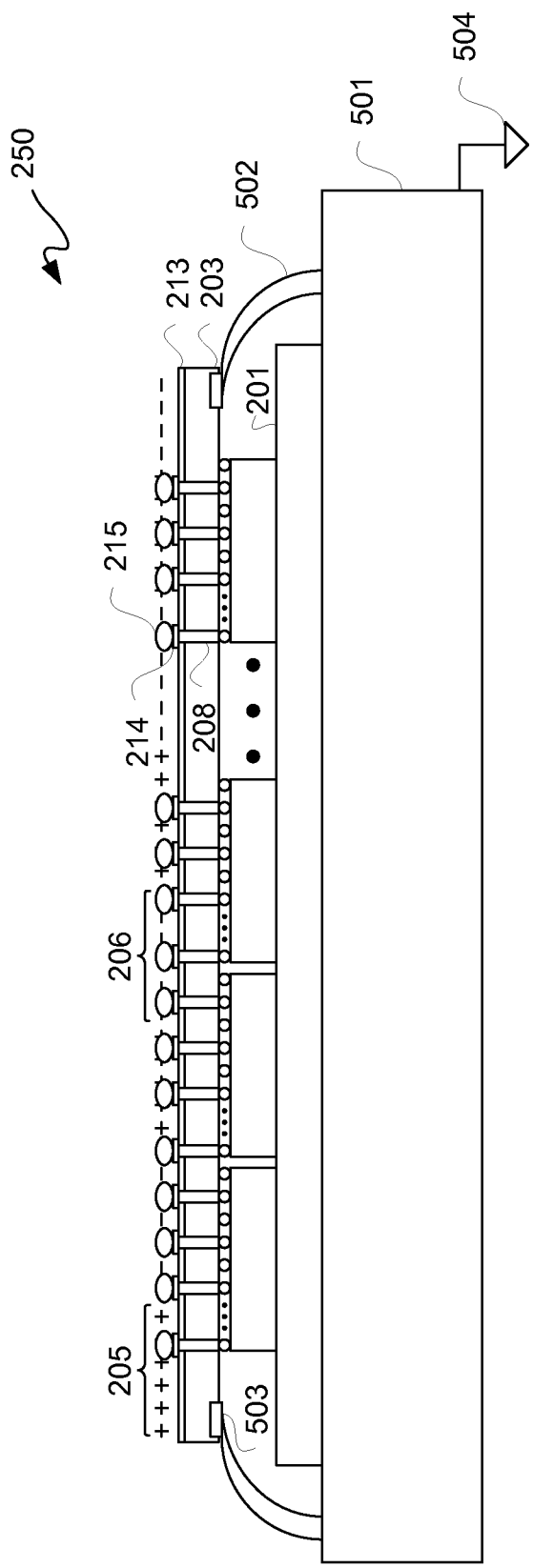
FIG. 5 is a block diagram depicting a cross-sectional side view of an exemplary tool stage or wafer holding chuck for in-situ process holding of the assembly of FIGS. 2-1 through 2-3.

FIG. 5 is a block diagram depicting a cross-sectional side view an exemplary tool stage or wafer holding chuck ("chuck") 501 for in-situ process holding of assembly 250 during fabrication. Chuck 501 may be coupled to a ground 504. Chuck 501 may have or have attached thereto one or more springs, clips, pins, or other mechanical contacts 502.

A front side surface 211 of interposer 203 may have one or more ground pads 503 for friction or other mechanical contact with such one or more corresponding mechanical contacts 502. Such contacts 502, as well as chuck 501, may thus couple interposer 203 to ground 504 to provide a discharge path for surface charges, for reasons as previously described herein. Ground pads 503 on front side surface 211 of interposer 203 may be used for interposer 203 to be in-situ grounded, namely generally being grounded during formation of a stacked die 200.

Ground pads 503 may be Vss pads, or may be "dummy" pads interconnected to Vss on an interposer wafer 300 for wafer-level grounding. Such an external grounding may help dissipate charges that accumulate during a CoW process flow, or a CoW on substrate ("CoWoS") process flow.

With the above description borne in mind, charge protection for one or more integrated circuit dies 202 is provided with charge attracting structures formed in interposer 203, as described below in additional detail, in order to protect one or more of integrated circuit dies 202 of a stacked die assembly. As described below in additional detail, interposers 203 may have charge protection structures, such as to protect transistors for example of integrated circuit dies 202 of a stacked die 200.

Figure 6:
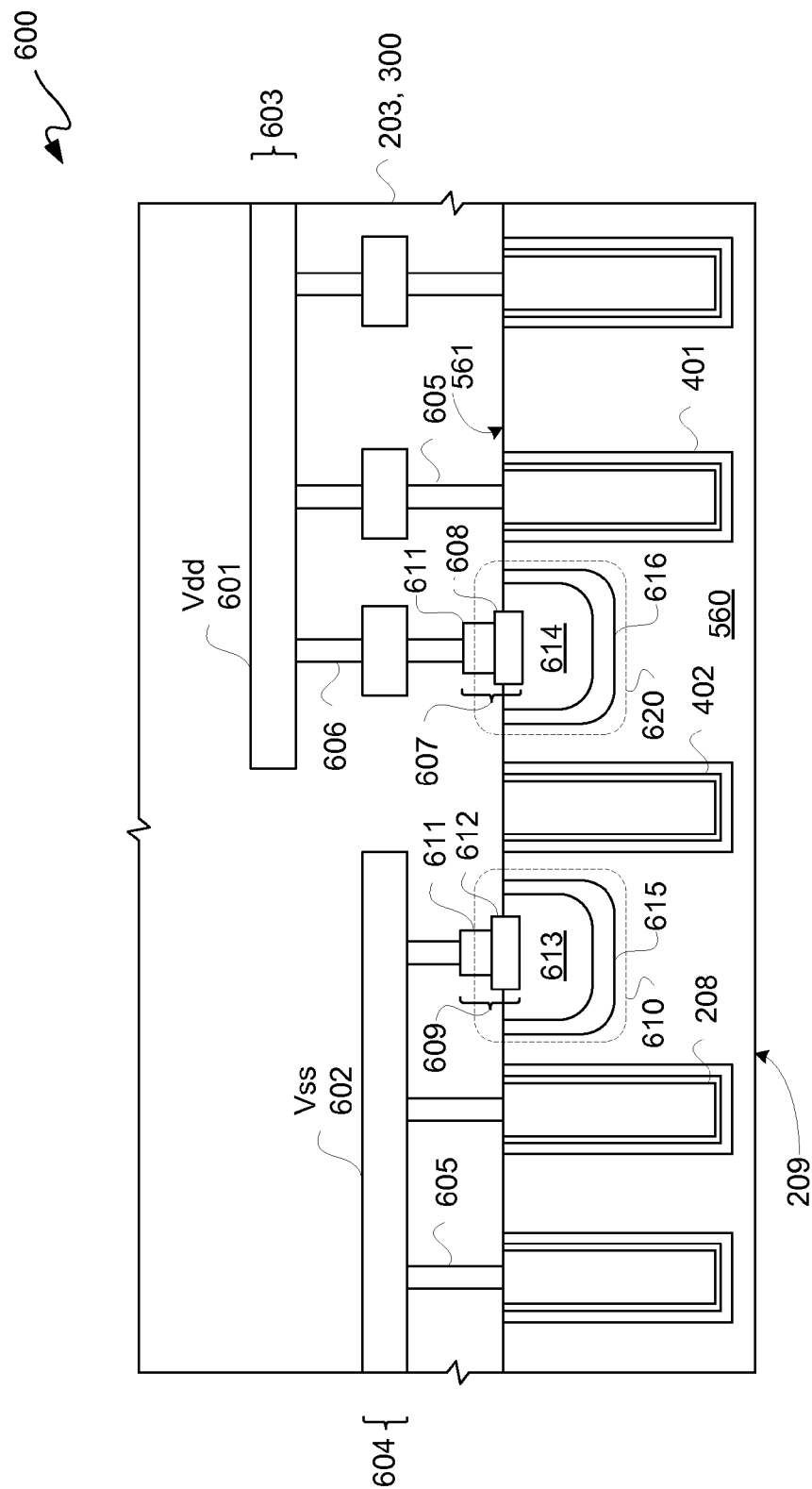
FIGS. 6 through 8 are block diagrams depicting cross-sectional side views of respective exemplary interposers, or portions thereof.
Figure 7:
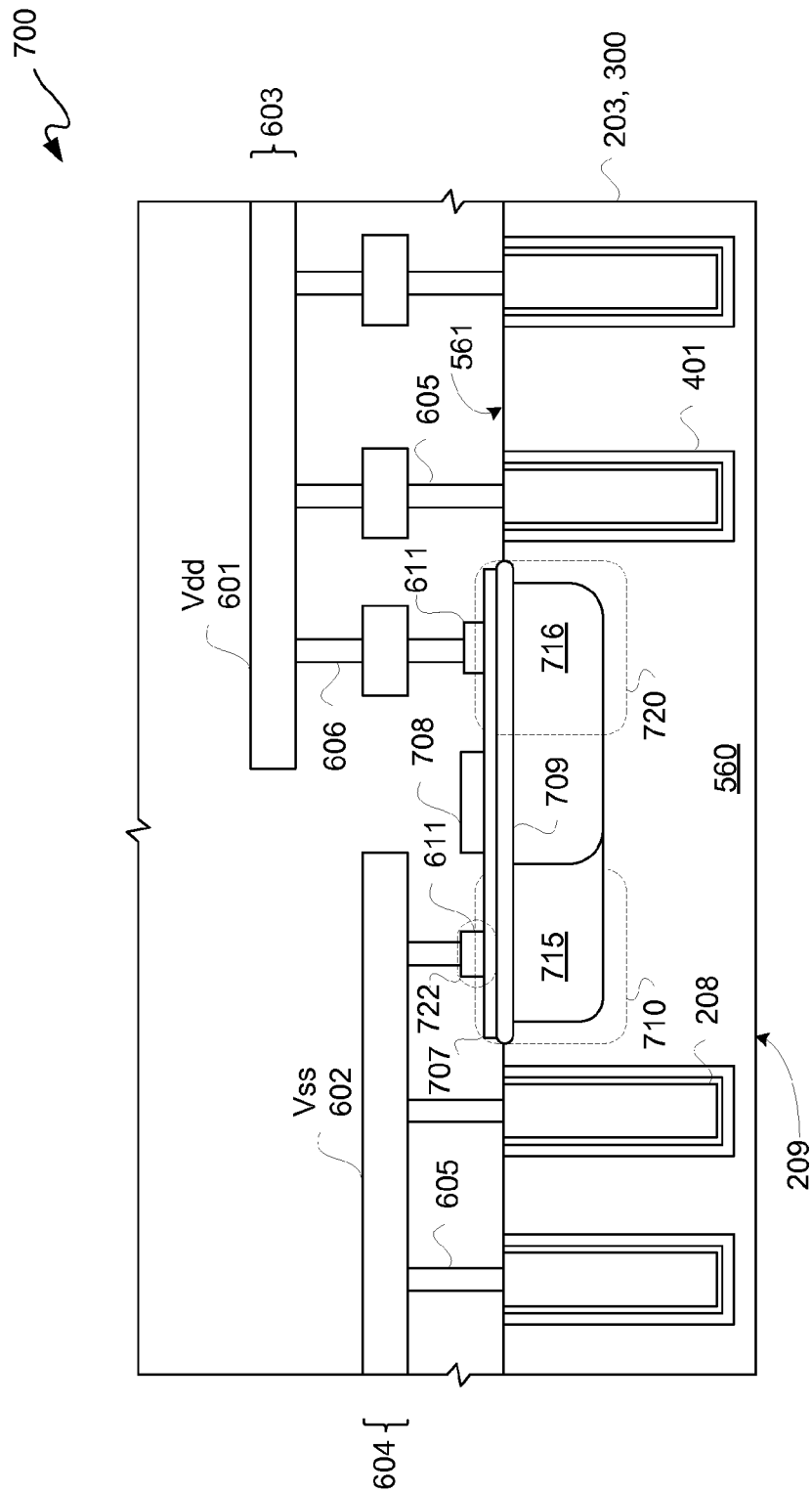
Figure 8:
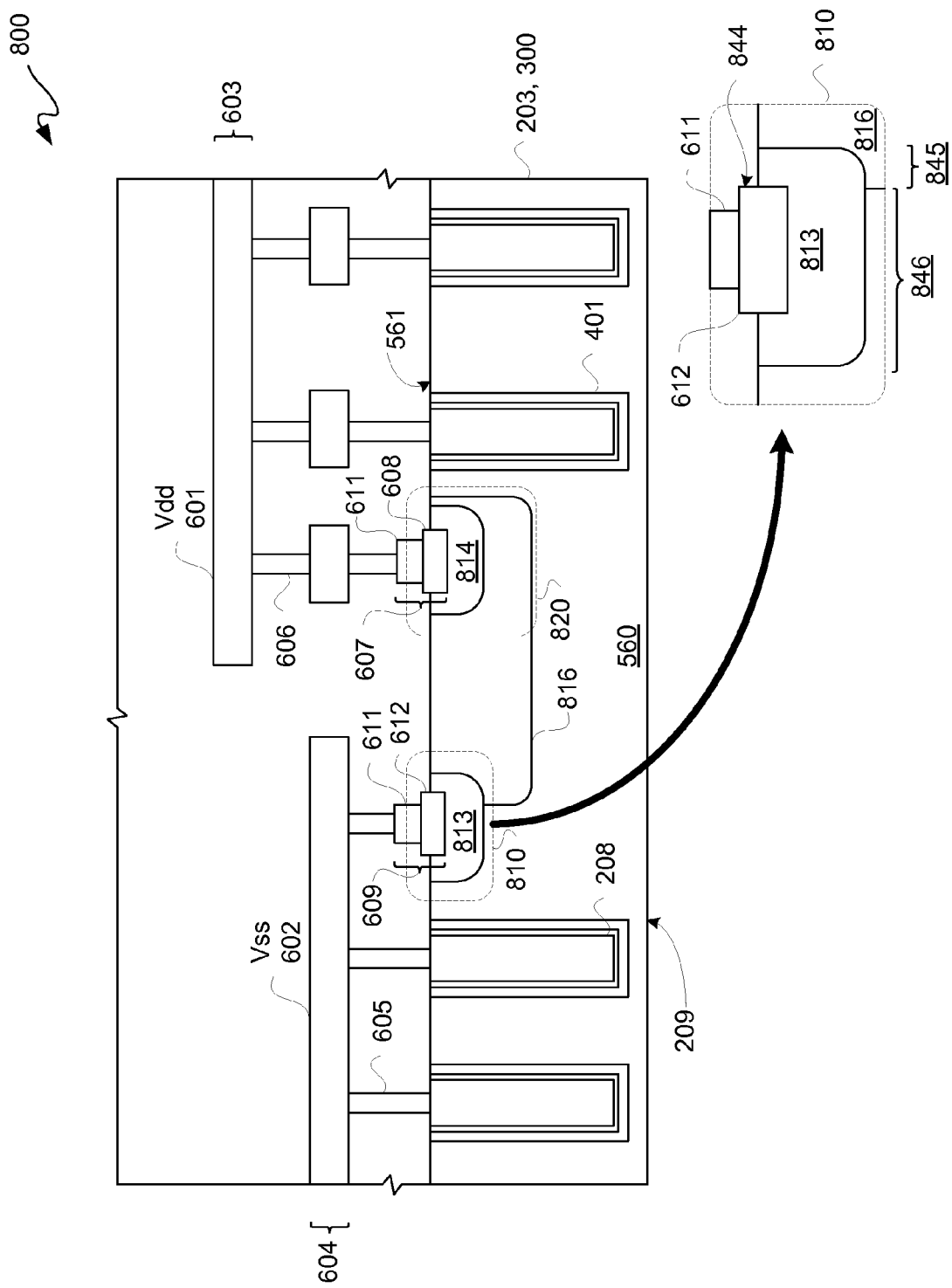

FIGS. 6 through 8 are block diagrams depicting respective cross-sectional side views of exemplary interposers, or portions thereof, 600 through 800, respectively, which may be a diced interposer 203, or an interposer 203 of an interposer wafer 300, for formation of a stacked die or a stack of dies ("stacked die") 200. Along those lines, an interposer, including without limitation a passive interposer, may be considered a die, though not referred to herein as such for purposes of clarity.

Each of interposers 600 through 800 may include a plurality of conductors and a plurality of charge attracting structures. Such charge attracting structures are to protect at least one integrated circuit die to be respectively coupled to any of such interposers to provide a stacked die 200. Such plurality of conductors includes TSVs 208.

With reference to FIG. 6, a well 615 is formed in interposer 600, or more particularly in substrate 560 of interposer 600. Well 615 may be a p-type well ("P-well"). Because for this example, substrate 560 is a p-type substrate, formation of a P-well 615 is optional. However, for purposes of clarity by way of example and not limitation, it shall be assumed that P-well 615 is formed. Furthermore, in an example where an opposite polarity substrate is used, then formation of an N-well 616, as described below in additional detail, would likewise be optional.

A region 613 may be formed in P-well 615. Region 613 may be a heavily doped n-type region ("N+ region"). A contact 609 may be formed for conducting charge from such contact to N+ region 613. Contact 609 may be formed by formation of a silicide region, such as for example NiSi, CoSi, or some other metal-silicide, to reduce contact resistance followed by deposition of a contact layer or metal cap 611, such as for example tungsten (W) or other metal. However, generally a single layer, two layer, or more than two layer electrical contacts may be used.

Optional P-well 615, N+ region 613, and contact 609 in combination may provide a charge attracting structure 610. Even though only a single instance of charge attracting structure 610 is illustratively depicted in FIG. 6 for purposes of clarity, it should be understood that multiple charge attracting structures 610 may be formed in substrate 560. Along those lines, each charge attracting structure 610, as well as each of the charge attracting structures subsequently described herein, is formed at or near a top surface 561 of substrate 560. Top surface 561 is opposite a back side surface 209 of interposer 600.

Contact 609 may be coupled to a ground bus 602 formed of a conductive layer 604. Contact 609 may be coupled to ground bus 602 through via layer 605. Via layer 605 may further couple ground bus 602 to one or more TSVs 208. In this example, conductive layers 603 and 604, as well as via layers 605 and 606, are copper-based layers. However, this is just an example of how contact 609 may be coupled to a ground bus 602, and accordingly other configurations of metal layers and/or via layers may be used.

Thus, a plurality of charge attracting structures 610 may be coupled to one or more ground buses 602 and to one or more TSVs 208 associated therewith to attract charged particles to such charge attracting structures. Because an N+ region 613 is used, such charged particles are generally going to be positive charges 205 obtained from a back side surface 209. Thus, when a back side surface 209 of interposer 600 is etched and/or back ground, such as by CMP for example, to exposed bottom ends of TSVs 208, positive charges on such surface may be conducted through such TSVs 208 through one or more ground buses 602 to one or more charge attracting structures 610. Along those lines, it may be a much shorter distance for charged particles to reach charge attracting structures 610, as well as all of the subsequently described charge attracting structures herein, than distances to reach silicides and p-n junctions in one or more integrated circuit dies 202. Not only is such distance shorter to such interposer charge attraction structures, but also such charge attraction structures have lower breakdown voltages than that of transistors on one or more top dies. Thus, charge attracting structures 610 may be more likely to attract enough positive charges 205 such that a remainder of such charges, if any, reaching destinations in one or more integrated circuit dies 202 may be in sufficient to cause any significant damage.

With continued reference to FIG. 6, a well 616 is formed in interposer 600, or more particularly in substrate 560 of interposer 600. Well 616 may be an n-type well ("N-well") and may be spaced apart from P-well 615. A region 614 may be formed in N-well 616. Region 614 may be a heavily doped p-type region ("P+ region"). A contact 607 may be formed for conducting charge from such contact to P+ region 614. Contact 607 may be formed by formation of a silicide region, such as for example NiSi or some other silicide, to reduce contact resistance followed by deposition of a metal cap 611, such as for example W or other metal. However, generally a single layer, two layer, or more than two layer electrical contact may be used. Contact 607 is similar to contact 609, except that contact 607 may have a more p-type silicided region 608 than silicided region 612, and vice versa with respect to n-type.

N-well 616, P+ region 614, and contact 607 in combination may provide a charge attracting structure 620. Even though only a single instance of charge attracting structure 620 is illustratively depicted in FIG. 6 for purposes of clarity, it should be understood that multiple charge attracting structures 620 may be formed in substrate 560. Again, each charge attracting structure 620, as well as each of the charge attracting structures subsequently described herein, is formed at or near a top surface 561 of substrate 560.

Contact 607 may be coupled to a supply bus 601, which for example may be a Vdd voltage supply bus formed of a conductive layer 603. Contact 607 may be coupled to supply bus 601 through a via layer 605, a conductive layer 604, and another via layer 606. Again, this is just an example of how contact 607 may be coupled to a supply bus 601, and other configurations are possible. Via layers 605 and 606, as well as conductor layer 604, may further coupled supply bus 601 to one or more TSVs 208.

Thus, a plurality of charge attracting structures 620 may be coupled to one or more supply buses 601 and to one or more TSVs 208 associated therewith to attract charged particles to such charge attracting structures. Because a P+ region 614 is used, such charged particles are generally going to be negative charges 206 obtained from a back side surface 209. Thus, when a back side surface 209 of interposer 600 is etched and/or back ground, such as by CMP for example, to exposed bottom ends of TSVs 208, negative charges on such surface may be conducted through such TSVs 208 through one or more supply buses 601 to one or more charge attracting structures 620. Again, it may be a much shorter distance for charged particles to reach charge attracting structures 620, as well as all of the subsequently described charge attracting structures herein, than distances to reach silicides and p-n junctions in one or more integrated circuit dies 202. Thus, charge attracting structures 620 may be more likely to attract enough negative charges 206 such that those, if any, of a remainder of such charges that reach destinations in one or more integrated circuit dies 202 is insufficient to cause any significant damage.

A breakdown voltage of charge attracting structure 610 may be lower than a breakdown voltage of source drain p-n junctions in at least one integrated circuit die 202. Likewise, a breakdown voltage of charge attracting structure 620 may be lower than another breakdown voltage of other source-drain p-n junctions in at least one integrated circuit die 202. A distinction may be made between NMOS and PMOS, for example, types of transistors as having different breakdown voltages and different susceptibilities to different types of charges, i.e., positive charge and negative charge, respectively.

However, generally, charge attracting structures 610 and 620 may be thought of as reverse bias diodes. Charge attracting structures 610 and 620 are not actually operative diodes in a classical sense, and thus interposer 600 is still a passive interposer. However, by having charge attracting structures, such as charge attracting structures 610 and 620 for example, with break down voltages lower than that of source-drain junctions of one or more integrated circuit dies or "top dies" 200, such charge attracting structures may break down before such source-drain junctions of transistors of such one or more integrated circuit dies 202. Furthermore, such charge attracting structures 610 and 620 may act as decoupling capacitors in contrast to a classical p-n junction diode, and thus may not impact speed, namely may not add additional loading to high frequency circuits, and may help stabilize a Vdd power supply. Furthermore, charge attracting structures 610 and 620 are reversible and non-destructive.

Figure 12:
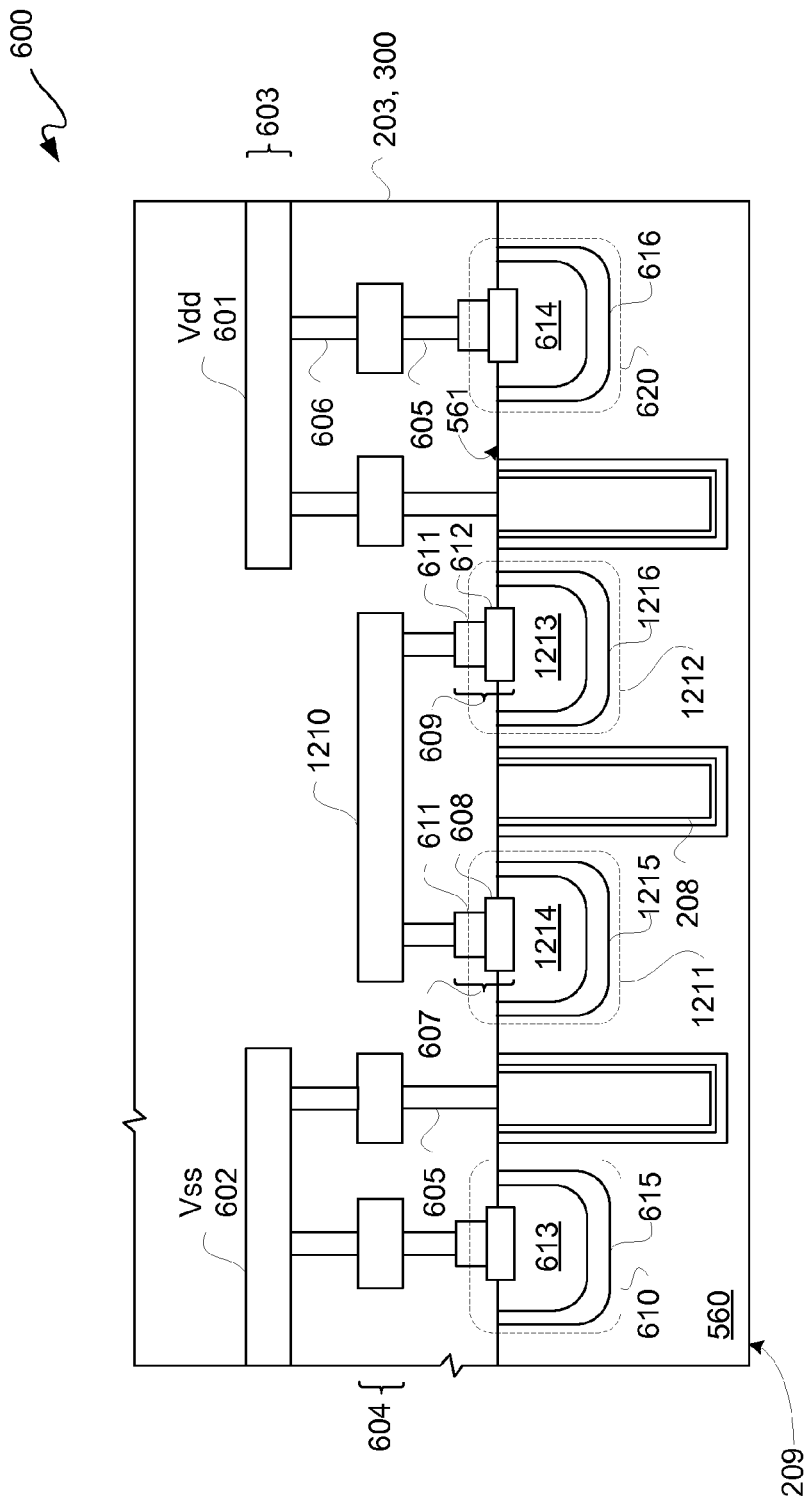
FIG. 12 is a block diagram a depicting cross-sectional side view of another exemplary interposer, or portion thereof.

FIG. 12 is a block diagram a depicting cross-sectional side view of another exemplary interposer, or portion thereof 600. FIG. 12 is similar to FIG. 6, and thus generally for purposes of clarity only the differences are described.

In this example of a diced interposer 203, or an interposer 203 of an interposer wafer 300, for formation of a stacked die 200, interposer 203 may be a passive interposer.

With reference to FIG. 12, a well 1215, which may be formed with well 615 is formed in interposer 600, or more particularly in substrate 560 of interposer 600. Well 1215, like well 615, may be a P-well. Because for this example, substrate 560 is a p-type substrate, formation of a P-well 1215 is optional. However, for purposes of clarity by way of example and not limitation, it shall be assumed that P-well 1215 is formed.

With continued reference to FIG. 6, a well 1216, which may be formed with well 616, is formed in interposer 600, or more particularly in substrate 560 of interposer 600. Well 1216 may be an N-well and may be spaced apart from P-well 1215. In this example, a TSV 208 is disposed between wells 1215 and 1216. Such TSV 208 may be for an I/O for example.

A region 1214, which may be formed with region 614, may be formed in P-well 1215. Region 1214 may be a $P^+$ region. A contact 607 may be formed for conducting charge from such contact to $P^+$ region 1214. Contact 607 may be coupled to a conductive line 1210. Conductive line 1210, of a conductive layer 604, may be coupled to contact 607 through a via provided with via layer 605. Conductive line 1210 may effectively be a dummy line.

A region 1213, which may be formed with region 613, may be formed in N-well 1216. Region 1213 may be an $N^+$ region. A contact 609 may be formed for conducting charge from such contact to $N^+$ region 1213. Contact 609 may be coupled to conductive line 1210 through a via provided with via layer 605.

P-well 1215, $P^+$ region 1214, and contact 607 in combination may provide a charge dissipating structure 1211. Even though only a single instance of charge dissipating structure 1211 is illustratively depicted in FIG. 12 for purposes of clarity, it should be understood that multiple charge dissipating structures 1211 may be formed in substrate 560. Along those lines, each charge dissipating structure 1211, as well as each of the charge attracting structures described herein, may be formed at or near a top surface 561 of substrate 560.

In this example, ground bus 602 is coupled to a charge attracting structure 610 through conductive layer 604 and via layers 605 and 606, such as described for example with reference to supply bus 601.

Thus, a plurality of charge dissipating structures 1211 may be coupled to one or more dummy conductive lines 1210. Charge dissipating structures 1211 may be used to help dissipated charge attracted via charge attracting structures described herein. Along those lines charge dissipating structures of opposite polarity may be used, as described below in additional detail.

N-well 1216, $N^+$ region 1213, and contact 609 in combination may provide a charge dissipating structure 1212. Even though only a single instance of charge dissipating structure 1212 is illustratively depicted in FIG. 12 for purposes of clarity, it should be understood that multiple charge dissipating structures 1212 may be formed in substrate 560. Again, each charge dissipating structure 1212 may be formed at or near a top surface 561 of substrate 560.

Thus, a plurality of charge dissipating structures 1211 and 1212 may be coupled to one another through one or more dummy conductive lines 1210. Charge dissipating structures 1211 and 1212 may be formed generally as described herein with respect to charge attracting structures 610 and 620, except that charge dissipating structures 1211 and 1212 may each be dual well structures, where wells of such respective structures are of a same polarity. Thus, charge dissipation structures may comprise p-type dual well structures and n-type dual well structures, wherein a p-type dual well structure 1211 is coupled to an n-type dual well structure 1212 through a conductive line 1210 to provide a virtual ground, as described below in additional detail.

Figure 13:
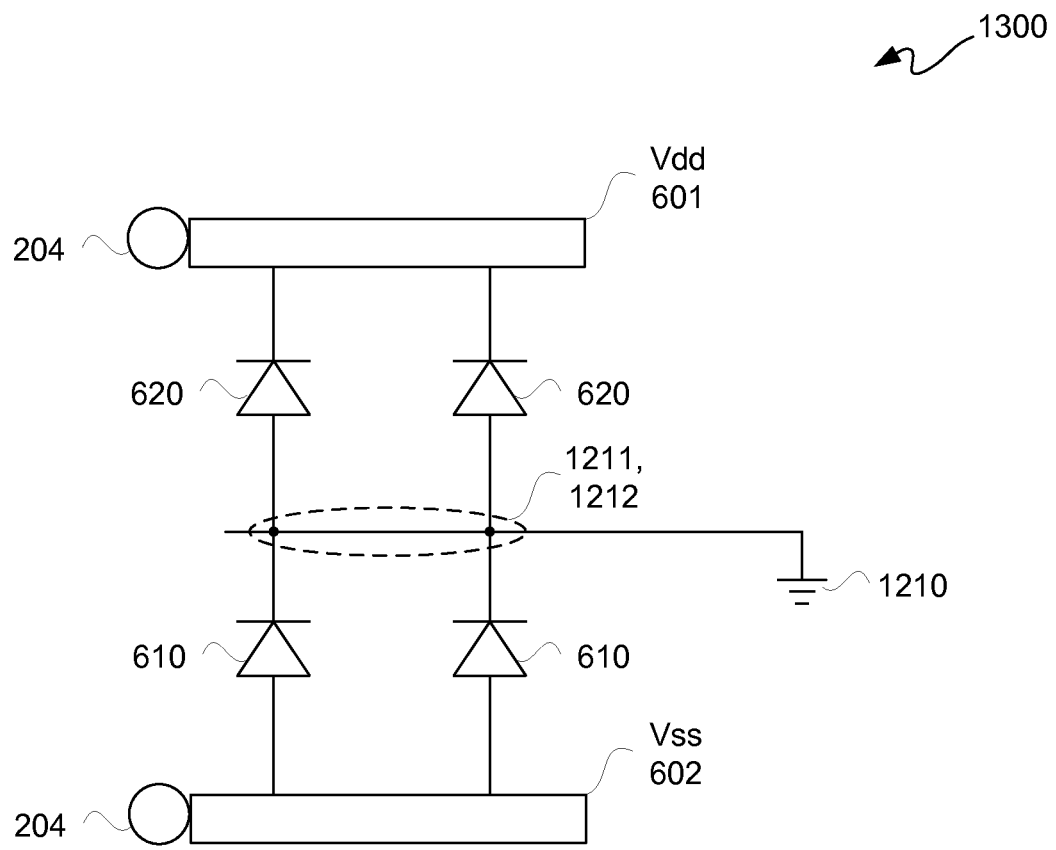
FIG. 13 is a block/circuit diagram depicting an exemplary circuit of the interposer of FIG. 12.

FIG. 13 is a block/circuit diagram depicting an exemplary circuit 1300 of an interposer 203 of FIG. 12. In this example, charge attracting structures 610 and 620 are illustratively depicted as diodes. A micro bump 204 may be coupled to a ground bus 602, which may include coupling to a TSV 208. Inputs of diodes 610 may be coupled to ground bus 602. Outputs of diodes 610 may be coupled to respective charge dissipating structures 1211 and 1212 through substrate 560. In this example, charge dissipating structures 1211 and 1212 are generally indicated as nodes. These nodes may be coupled to a virtual ground 1210, namely a dummy conductive line 1210. Inputs of diodes 620 may be coupled to such nodes, and outputs of diodes 620 may be coupled to supply bus 601. Supply bus 601 may be coupled to another micro bump 204, which may include coupling to another TSV 208. Thus, charges attracted by charge attracting structures may be more readily dissipated from substrate 560 to such virtual ground 1210. Even though charge attracting structures 610 and 620 were described with reference to charge dissipating structures 1211 and 1212, charge attracting structures described with reference to FIG. 8 may likewise be used.

With reference to FIG. 7, a well 715 is formed in substrate 560. Again, because substrate 560 is p-type in this example, well 715 may be a P-well. However, in another configuration, opposite polarity may be used. A well 716, opposite in polarity to well 715, is formed in substrate 560 overlapping, adjacent to, or at least proximate to P-well 715. In other words with respect to the lattermost configuration, wells 715 and 716 in some instances may be slightly spaced apart. Wells 715 and 716, like wells 615 and 616, may be formed using a low-power implant, as shallow wells may be desirable in order to enhance attracting of charged particles, for reasons as previously described.

A dielectric layer 709 may be formed on or over wells 715 and 716, and such dielectric layer may extend beyond the boundaries of such wells. In this example, dielectric layer 709 is a thin oxide layer. Such thin oxide layer may be grown by rapid thermal oxidation or other oxidation process. Optionally, such dielectric layer may be deposited. By having a thin dielectric layer 709, a lower break down voltage than p-n junctions of one or more of integrated circuit dies 202 may be obtained for charge attracting structures 710 and 720. Such a thin oxide layer may effectively be used as plasma charge protection fuse for example, as break down voltage of very thin oxide can be very low. However, once "blown," such thin oxide does not provide subsequent protection. Thus, a leakage current block may be added, such as described below, to cut off a leakage path to a power supply should such thin oxide be "blown."

Over or on dielectric layer 709 may be formed a conductive layer 707. In this example, conductive layer 709 may be formed by deposition of a polycrystalline silicon ("poly"). To prevent leakage current from going from supply bus 601 through to P-well 715 if such thin dielectric layer 709 is broken due to discharging on a Vdd side, namely with respect to charge attracting structure 720, a silicide block layer ("silicide block") 708, such as with deposition of nitride or some other dielectric layer, may be formed on conductive layer 707 between capping metal layer 611 to be formed prior to silicidation in order to provide respective contacts 722. Along those lines, none or very little of poly layer 707 under which silicide block 708 is located may be silicided during silicidation of capping metal layer 611, such as Ni or Co, with poly layer 707. A conductive layer 611, such as for example Ni or Co or other metal, may be deposited and etched, followed by an anneal to form silicides, such as NiSi or CoSi for example. Resistance of poly layer 707 should be sufficiently high to provide sufficient leakage current blockage. In other words, effectively conductively layer 707 is divided by silicide block 708 into a first portion associated with a contact pad 611 of charge attracting structure 710 and a second portion associated with a contact pad 611 associated with charge attracting structure 720. Thus, conductive layers 707 and 611 may be used to provide respective contacts 722 for charge attracting structures 710 and 720. However, generally a single layer, two layer, or more than two layer electrical contacts may be used.

Contacts 722 allow for conducting charge therefrom through dielectric layer 709 to wells 715 and 716 respectively of charge attracting structures 710 and 720. Accordingly, P-well 715, a portion of dielectric layer 709, and a contact 722 in combination provide a charge attracting structure 710. Even though only a single instance of charge attracting structure 710 is illustratively depicted for clarity, interposer 700 may include a plurality of charge attracting structures 710 to attract charged particles. Likewise, N-well 716, another portion of dielectric layer 709, and another contact 722 in combination provide a charge attracting structure 720. Again, even though only a single instance of charge attracting structure 720 is illustratively depicted for clarity, interposer 700 may include a plurality of charge attracting structures 720 to attract charged particles.

Ground bus 602 may be coupled to metal cap 611 of charge attracting structure 710, as previously described and not repeated for purposes of clarity. Likewise, supply bus 601 may be coupled to capping layer 611 of charge attracting structure 720, as previously described and not repeated for purposes of clarity. Again, breakdown voltages of charge attracting structures 710 and 720 are lower than breakdown voltages of p-n junctions of one or more integrated circuit dies 202, such as source-drain junctions of NMOS and PMOS transistors for example.

Wells 715 and 716 effectively just dissipate charge, and thus interposer 700 may be considered a passive interposer. However, in this configuration, P-well 715 attracts positive charges 205 from back side surface 209 after bottom ends of TSVs 208 are exposed, and N-well 716 attracts negative charges 206 from back side surface 209 after bottom ends of TSVs 208 are exposed. Thus, charge attracting structures 710 and 720 may be more likely to attract enough charged particles such that those, if any, of a remainder of such particles that reach destinations in one or more integrated circuit dies 202 may be insufficient to cause any significant damage.

With reference to FIG. 8, a well 816 is formed in interposer 600, or more particularly in substrate 560 of interposer 600. Well 816 may be an n-type well ("N-well"). Furthermore, in an example where an opposite polarity substrate is used, then formation of a P-well may be used.

A region 813 may be formed in interposer 560. Region 813 may be a heavily doped n-type region ("$N^+$ region"). Optionally, a threshold voltage adjustment implant ("Vt implant") may be follow an N+ implant used to form $N^+$ region 813. A contact 609 may be formed for conducting charge from such contact to $N^+$ region 813, such as previously described with reference to region 613 and thus not repeated here for purpose of clarity. Thus, a plurality of charge attracting structures 810 may be coupled to one or more ground buses 602 and to one or more TSVs 208 associated therewith to attract charged particles to such charge attracting structures. Because an N+ region 613 is used, such charged particles are generally going to be positive charges 205 from TSVs 208 exposed on a back side surface 209.

With continued reference to FIG. 8, a region 814 may be formed in N-well 816. Region 814 may be a heavily doped p-type region ("$P^+$ region"). Optionally, a Vt implant may be follow a P+ implant used to form $P^+$ region 814 to provide such region. A contact 607 may be formed for conducting charge from such contact to $P^+$ region 814, such as previously described with reference to region 613 and thus not repeated here for purpose of clarity. Thus, a plurality of charge attracting structures 820 may be coupled to one or more supply buses 601 and to one or more TSVs 208 associated therewith to attract charged particles to such charge attracting structures. Because a $P^+$ region 814 is used, such charged particles are generally going to be negative charges 206 from TSVs 208 exposed on a back side surface 209.

With particular reference to an enlarged view of charge attracting structure 810 of FIG. 8, a portion 845 of region 813 extends into well 816 and a remainder or other portion 846 of region 813 does not extend into well 816. For purposes of by way of example and not limitation, portion 845 may be from a proximal edge 844 of silicide contact 612 with respect to well 816 and into well 816 a sufficient distance such that breakdown voltage is sufficiently lowered. In other words, having this partial extension of region 813 into well 816 may lower a breakdown voltage of charge attracting structure 820. Additionally, a silicide layer used to form silicide contacts 612 and 608, which is the same silicide layer, may further lower breakdown voltage due to reducing contact resistance.

Portion 846 of region 813 and contact 609 in combination provide a charge attracting structure 810 to attract charged particles, and well 816, region 814, portion 845 of region 813, and contact 607 in combination provide a charge attracting structure 820 to attract charged particles. Even though only a single instance of charge attracting structures 810 and 820 are illustratively depicted in FIG. 8 for purposes of clarity, it should be understood that multiple charge attracting structures 810 and/or 820 may be formed in substrate 560. Again, each of charge attracting structures 810 and 820 is formed at or near a top surface 561 of substrate 560 to reduce distance charges 205 and 206 travel to reach such structures.

When a back side surface 209 of interposer 800 is etched and/or back ground, such as by CMP for example, to exposed bottom ends of TSVs 208, charged particles on such surface may be conducted through such TSVs 208 through one or more buses 601 and 602 to one or more of charge attracting structures 820 and 810, respectively. Along those lines, it may be a much shorter distance for charged particles to reach charge attracting structures 810 and 820, than distances to reach silicides and p-n junctions in one or more integrated circuit dies 202. Furthermore, charge attracting structures 810 and 820 have lower breakdown voltages than transistors in one or more integrated circuit dies 202. Thus, charge attracting structures 810 and 820 may be more likely to attract enough charged particles such that those, if any, of a remainder of such particles that reach destinations in one or more integrated circuit dies 202 may be insufficient to cause any significant damage.

A breakdown voltage of charge attracting structure 810 may be lower than a breakdown voltage of source drain p-n junctions in at least one integrated circuit die 202. Likewise, a breakdown voltage of charge attracting structure 820 may be lower than another breakdown voltage of other source-drain p-n junctions in at least one integrated circuit die 202. Again, a distinction may be made between NMOS and PMOS, for example, types of transistors as having different breakdown voltages and different susceptibilities to different types of charges, i.e., positive charge and negative charge, respectively. As charge attracting structures 810 and 820 are for dissipation of charged particles, interposer 800 may be considered a passive interposer.

With reference to FIGS. 6 through 8, each of the implants used to form wells and/or regions may be low voltage implants, as such wells and/or regions may be shallow in order to promote a low breakdown voltage of charge attracting structures 610, 620, 710, 720, 810, and 820. Furthermore, charge attracting structures 610, 620, 710, 720, 810, and 820 are not small structures like integrated circuit transistors. For example, charge attracting structures 610, 620, 710, 720, 810, and 820 may be greater than at least one micron and may be at least 2 or more microns wide.

Figure 9:
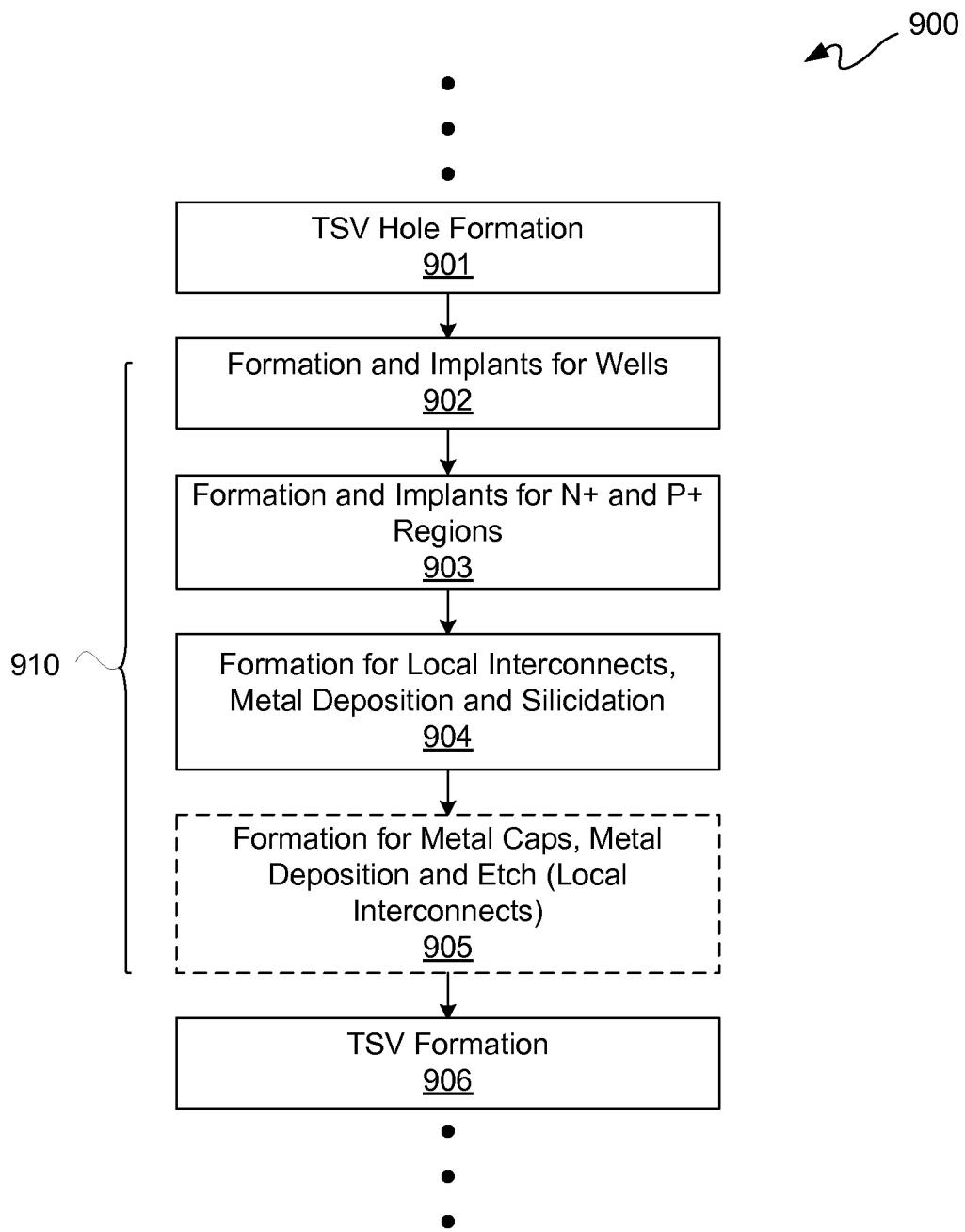
FIGS. 9 through 11 are respective flow diagrams depicting exemplary process flows corresponding to formation of the interposers of FIGS. 6 through 8, respectively.
Figure 10:
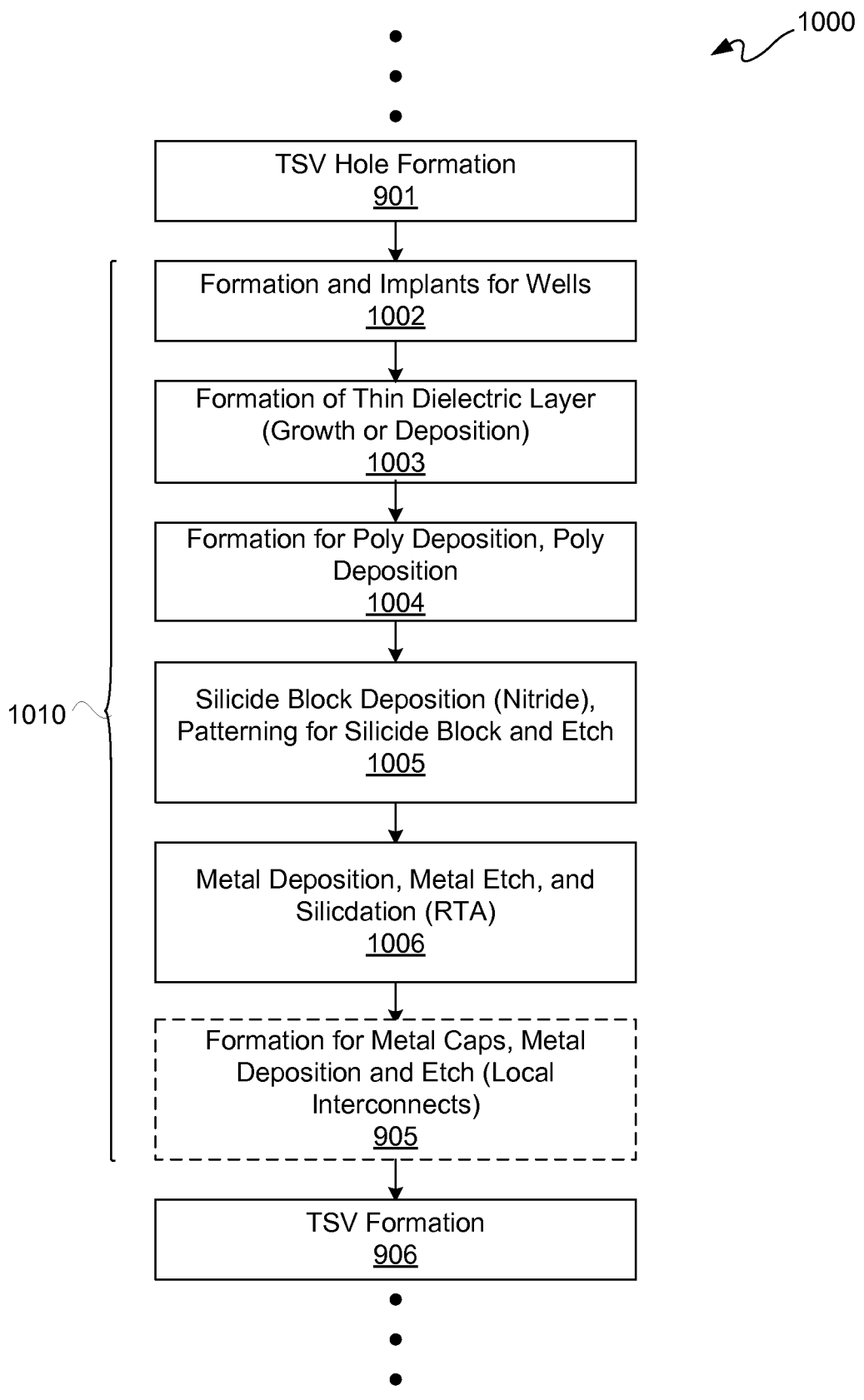
Figure 11:
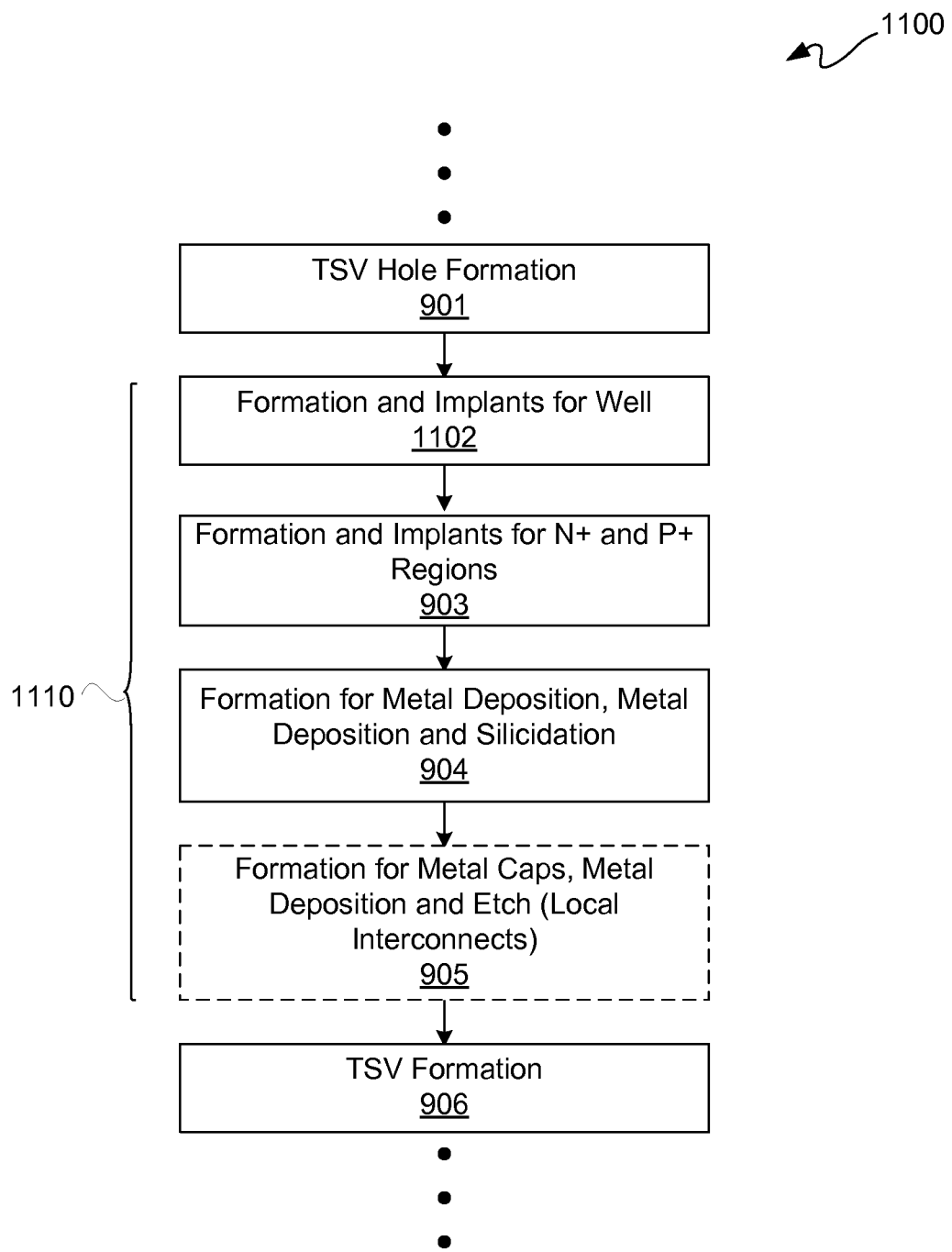

FIGS. 9 through 11 are respective flow diagrams depicting exemplary process flows 900, 1000, and 1100 corresponding to formation of interposers 600, 700, and 800. For clarity, each of process flows 900, 1000, and 1100 starts from a conventional operation of TSV hole formation at 901, which may include etching TSV holes and formation by oxidation or deposition of a dielectric layer therein for example, where prior conventional operations are not illustratively depicted. Furthermore, for clarity each of process flows 900, 1000, and 1100 ends with a conventional operation of TSV formation at 906, such as barrier layer deposition, copper plating, and copper CMP for example, where subsequent conventional operations are not illustratively depicted. Operations at 901 and 906 may be combined at 906 when a TSV oxide is formed by CVD or wet oxidation.

With reference to FIGS. 6 and 9, from 901, at 902, formation of a pattern for an implant of well 616, an implant of well 616, optional formation of a pattern for an implant of well 615, and an optional implant of well 615 may be performed. At 903, formation of a pattern for an implant of region 614, an implant of region 614, formation of a pattern for an implant of region 613, and an implant of region 613 may be performed. At 904, formation of a pattern for local interconnects 612, deposition of a metal layer 612, and silicidation of metal layer 612 with a portion of silicon of each of regions 613 and 614 may be performed. Silicidation may be performed with a rapid thermal anneal ("RTA"). Optionally, at 905, formation of a pattern for metal caps 611, deposition of a conductive layer 611, and a metal etch may be performed to form local interconnects. Operations at 905 may be optional, as metal caps 611 may be omitted in formation of local interconnects or contacts. After operations at 904 or optionally at 905, conventional processing may follow at 906. Operations 910, namely operations for 902 through 904 and optionally 905, may be for a CoWoS process flow 900.

With reference to FIGS. 7 and 10, from 901, at 1002, formation of a pattern for an implant of well 715, an implant of well 715, formation of a pattern for an implant of well 716, and an implant of well 716 may be performed. At 1003, formation of a pattern for deposition or growth of a thin dielectric layer 709 and deposition or growth of a thin dielectric layer may be performed. At 1004, formation of a pattern for poly layer and deposition of a poly layer may be performed to provide conductive layer 707. Furthermore, at 1005, deposition of a silicide block layer such as nitride or other dielectric, patterning of such silicide block layer 708, and etch of such dielectric layer may be performed to provide a silicide block 708. From 1005, at 1006 a metal deposition, such as of Ni or Co or other metal for silicidation, metal etch, and silicidation, such as with a Rapid Thermal Anneal ("RTA"), may be performed. Optionally, from 1006, at 905 metal caps 611 may be formed to provide local interconnects or contacts, such as previously described. After operations at 1006 or optionally at 905, conventional processing may follow at 906. Operations 1010, namely operations for 1002 through 1006 and 905, may be for a CoWoS process flow 1000.

With reference to FIGS. 8 and 11, from 901, at 1102, formation of a pattern for an implant of well 816 and an implant of well 816 may be performed. From 1102, at 903, formation of a pattern for an implant of region 814, an implant of region 814, formation of a pattern for an implant of region 813, and an implant of region 813 may be performed. At 904, formation of a pattern for deposition of a metal layer 612, deposition of a metal layer 612, and silicidation of metal layer 612 with a portion of silicon of each of regions 813 and 814 may be performed. Optionally at 905, formation of metal caps 611 may be performed, as previously described. After operations at 905, conventional processing may follow at 906. Operations 1110, namely operations for 1102, 903, and 904, as well as optionally 905, may be for a CoWoS process flow 1100.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
    an interposer having one or more conductive layers disposed on a top surface of an interposer substrate, the interposer substrate having a plurality of conductors and a plurality of passive charge attracting structures;
    wherein the plurality of passive charge attracting structures are configured to protect at least one integrated circuit die to be coupled to the interposer to provide a stacked die;
    wherein the plurality of conductors include a plurality of through-substrate vias formed through the interposer substrate and coupled within the interposer substrate to the plurality of passive charge attracting structures through one or more conductive layer;
    a first well formed in the interposer substrate;
    a first region formed in the first well;
    a second region formed in the interposer substrate;
    wherein a first portion of the second region extends into the first well and a second portion of the second region does not extend into the first well;
    a first contact formed for conducting charge therefrom to the first region;

a second contact formed for conducting charge therefrom to the second region;
wherein the second portion of the second region and the second contact in combination provide a first charge attracting structure of the plurality of passive charge attracting substrates to attract first charged particles; and
wherein the first well, the first region, the first portion of the second region, and the first contact in combination provide a second charge attracting structure of the plurality of passive charge attracting substrates to attract second charged particles.

2. The apparatus according to claim 1, further comprising:
a third charge attracting structure of the plurality of passive charge attracting structures comprising:
  a second well formed in the interposer substrate;
  a third well formed in the second well;
  a second region formed in the third well; and
  a second contact formed for conducting charge therefrom to the second region;
  wherein the second well, the third well, the second region, and the second contact in combination provide a third charge attracting structure of the plurality of passive charge attracting structures to attract third charged particles.

3. The apparatus according to claim 2, further comprising:
a fourth well formed in the interposer substrate;
wherein the first well is formed in the fourth well;
wherein the fourth well and the interposer substrate of the interposer are of a same polarity type; and
wherein the fourth well is part of the first charge attracting structure.

4. The apparatus according to claim 2, further comprising:
a ground bus coupling the first charge attracting structure to a first portion of the plurality of through-substrate vias; and
a supply bus coupling the second charge attracting structure to a second portion of the plurality of through-substrate vias.

5. The apparatus according to claim 4, further comprising:
the at least one integrated circuit die coupled to the interposer to provide the stacked die;
wherein a first breakdown voltage of the first charge attracting structure is lower than a second breakdown voltage of first p-n junctions in the at least one integrated circuit die; and
wherein a third breakdown voltage of the second charge attracting structure is lower than a fourth breakdown voltage of second p-n junctions in the at least one integrated circuit die.

6. The apparatus according to claim 2, wherein:
the interposer includes a ground pad on a front side surface of the interposer to ground the interposer in-situ during formation of the stacked die;
the first charge attracting structure and the second charge attracting structure of the plurality of passive charge attracting structures are positioned on or proximate to the top surface of the interposer substrate to attract the first charged particles and the second charged particles, respectively; and
the top surface is opposite a back side surface of the interposer substrate.

7. The apparatus according to claim 1, wherein the interposer substrate further comprises:
charge dissipation structures;
wherein the charge dissipation structures comprise a p-type dual well structure and an n-type dual well structure;
wherein the p-type dual well structure is coupled to the n-type dual well structure through a conductive line to provide a virtual ground.

8. The apparatus according to claim 1, further comprising:
a second well formed in the interposer substrate overlapping, adjacent or at least proximate to the first well;
wherein the second well is of an opposite polarity type with respect to the first well;
a dielectric layer formed on the first well and the second well;
the first contact formed for conducting charge therefrom to the first well through the dielectric layer;
a third contact formed for conducting charge therefrom to the second well through the dielectric layer;
wherein the dielectric layer is part of the first charge attracting structure; and
wherein the second well, the dielectric layer, and the second contact in combination provide a third charge attracting structure of the plurality of passive charge attracting structures to attract third charged particles.

9. The apparatus according to claim 8, further comprising:
a silicide block formed between the first contact and the second contact;
wherein the first contact and the second contact are formed with a first conductive layer and a second conductive layer;
wherein the first conductive layer is on the dielectric layer;
wherein the second conductive layer is on the first conductive layer;
wherein the second conductive layer is formed as a first pad and a second pad spaced apart from one another; and
wherein the first conductive layer is divided by the silicide block into a first portion associated with the first contact pad and a second portion associated with the second contact pad.

10. The apparatus according to claim 8, further comprising:
a ground bus coupling the first charge attracting structure to a first portion of the plurality of conductors; and
a supply bus coupling the second charge attracting structure to a second portion of the plurality of conductors.

11. The apparatus according to claim 8, further comprising:
the at least one integrated circuit die coupled to the interposer to provide the stacked die;
wherein a first breakdown voltage of the first charge attracting structure is lower than a second breakdown voltage of first p-n junctions in the at least one integrated circuit die; and
wherein a third breakdown voltage of the second charge attracting structure is lower than a fourth breakdown voltage of second p-n junctions in the at least one integrated circuit die.

12. The apparatus according to claim 8, wherein the interposer is a passive interposer.

13. An apparatus, comprising:
an interposer having a plurality of conductors and a plurality of charge attracting structures;
wherein the plurality of charge attracting structures are to protect at least one integrated circuit die to be coupled to the interposer to provide a stacked die;
wherein the plurality of conductors include a plurality of through-substrate vias:
a well formed in a substrate of the interposer;
a first region formed in the well;
a second region formed in the substrate;

wherein a first portion of the second region extends into the well and a second portion of the second region does not extend into the well;

a first contact formed for conducting charge therefrom to the first region;

a second contact formed for conducting charge therefrom to the second region;

wherein the second portion of the second region and the second contact in combination provide a first charge attracting structure to attract first charged particles; and wherein the well, the first region, the first portion of the second region, and the first contact in combination provide a second charge attracting structure to attract second charged particles.

14. The apparatus according to claim 13, further comprising:

a ground bus coupling the first charge attracting structure to a first portion of the plurality of conductors; and a supply bus coupling the second charge attracting structure to a second portion of the plurality of conductors.

15. The apparatus according to claim 13, further comprising:

the at least one integrated circuit die coupled to the interposer to provide the stacked die;

wherein a first breakdown voltage of the first charge attracting structure is lower than a second breakdown voltage of first p-n junctions in the at least one integrated circuit die; and wherein a third breakdown voltage of the second charge attracting structure is lower than a fourth breakdown voltage of second p-n junctions in the at least one integrated circuit die.

16. The apparatus according to claim 15, wherein:

the interposer includes a ground pad on a front side surface of the interposer to ground the interposer in-situ during formation of the stacked die;

the first charge attracting structure and the second charge attracting structure of the plurality of charge attracting structures are positioned on or proximate to a top surface of a silicon substrate of the interposer to attract the first charged particles and the second charged particles, respectively; and the top surface is opposite a back side surface of the interposer.

17. The apparatus according to claim 1, further comprising:

a ground bus coupling the first charge attracting structure to a first portion of the plurality of conductors; and a supply bus coupling the second charge attracting structure to a second portion of the plurality of conductors.

18. The apparatus according to claim 1, further comprising:

the at least one integrated circuit die coupled to the interposer to provide the stacked die;

wherein a first breakdown voltage of the first charge attracting structure is lower than a second breakdown voltage of first p-n junctions in the at least one integrated circuit die; and wherein a third breakdown voltage of the second charge attracting structure is lower than a fourth breakdown voltage of second p-n junctions in the at least one integrated circuit die.

19. The apparatus according to claim 18, wherein:

the interposer includes a ground pad on a front side surface of the interposer to ground the interposer in-situ during formation of the stacked die;

the first charge attracting structure and the second charge attracting structure of the plurality of charge attracting structures are positioned on or proximate to the top surface the interposer substrate to attract the first charged particles and the second charged particles, respectively; and the top surface is opposite a back side surface of the interposer.

\* \* \* \* \*